United States Patent
Pradeep et al.

(10) Patent No.: US 11,680,984 B1
(45) Date of Patent: Jun. 20, 2023

(54) CONTROL DATA REGISTERS FOR SCAN TESTING

(71) Applicant: TEXAS INSTRUMENTS INCORPORATED, Dallas, TX (US)

(72) Inventors: Wilson Pradeep, Bangalore (IN); Aravinda Acharya, Bangalore (IN); Nikita Naresh, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/683,126

(22) Filed: Feb. 28, 2022

(51) Int. Cl.
 *G01R 31/3185* (2006.01)
 *G01R 31/317* (2006.01)
 *G01R 31/319* (2006.01)
 *G01R 31/3177* (2006.01)

(52) U.S. Cl.
 CPC ......... *G01R 31/318536* (2013.01); *G01R 31/3177* (2013.01); *G01R 31/31727* (2013.01); *G01R 31/31926* (2013.01)

(58) Field of Classification Search
 CPC ...... G01R 31/318536; G01R 31/31727; G01R 31/3177; G01R 31/31926
 USPC ......................................... 714/726, 727, 729
 See application file for complete search history.

(56) References Cited

U.S. PATENT DOCUMENTS

| | | | | |
|---|---|---|---|---|
| 7,174,492 B1 * | 2/2007 | Chung | ........... | G01R 31/318577 714/738 |
| 7,269,770 B1 * | 9/2007 | Chung | ........... | G01R 31/318577 714/729 |
| 2003/0110431 A1 * | 6/2003 | Davies | ........... | G06F 11/267 714/E11.16 |
| 2011/0072323 A1 * | 3/2011 | Chong | ........... | G11C 29/32 714/719 |

OTHER PUBLICATIONS

"IEEE Standard for Test Access Port and Boundary-Scan Architecture," in IEEE Std 1149.1-2013 (Revision of IEEE Std 1149.1-2001), vol. No. pp. 1-444, May 13, 2013, doi: 10.1109/IEEESTD.2013.6515989.
"IEEE Standard Testability Method for Embedded Core-based Integrated Circuits," in IEEE Std 1500-2005, vol. No. pp. 1-136, Aug. 29, 2005, doi: 10.1109/IEEESTD.2005.96465.
"IEEE Standard for Reduced-Pin and Enhanced-Functionality Test Access Port and Boundary-Scan Architecture," in EEE Std 1149.7-2009, vol. No. pp. 1-985, Feb. 10, 2010, doi: 10.1109/IEEESTD.2010.5412866.

* cited by examiner

*Primary Examiner* — John J Tabone, Jr.
(74) *Attorney, Agent, or Firm* — Carl G. Peterson; Frank D. Cimino

(57) ABSTRACT

In some examples, a circuit includes a custom control data register (CCDR) circuit having a scan path. The CCDR circuit includes a shift register and an update register. The shift register is configured to receive scan data from a scan data input (CDR_SCAN_IN) on a first clock edge responsive to a scan enable signal (CDR_SCAN_EN) being enabled. The update register is configured to receive data from the shift register on a second clock edge after the first clock edge when the scan enable (CDR_SCAN_EN) is enabled. The update register data is asserted as a scan data output (CDR_SCAN_OUT). The second scan path includes the scan data input, the shift register, the update register, and the scan data output.

20 Claims, 4 Drawing Sheets

CONTROL DATA REGISTERS FOR SCAN TESTING

BACKGROUND

After manufacture, digital hardware is often tested using various methods to ensure correct circuit behavior and to identify particular faults, including manufacturing defects. To facilitate testing, a scan cell may be inserted along the boundary between various digital elements or within the core of a digital system. A scan cell may include one or more registers that are configured to receive test data, apply the test data to coupled logic elements, and capture test results. Various standards have been developed to promote efficient testing and improve quality, including The Institute of Electrical and Electronic Engineers (IEEE) standard 1149.1 entitled Standard Test Access Port and Boundary Scan Architecture, and IEEE standard 1500 entitled Standard Testability Method for Embedded Core-based Integrated Circuits, and others.

SUMMARY

In some examples, a circuit includes a custom control data register (CCDR) circuit having a scan path. The CCDR circuit includes a shift register and an update register. The shift register is configured to receive scan data from a scan data input (CDR_SCAN_IN) on a first clock edge responsive to a scan enable signal (CDR_SCAN_EN) being enabled. The update register is configured to receive data from the shift register on a second clock edge after the first clock edge when the scan enable (CDR_SCAN_EN) is enabled. The update register data is asserted as a scan data output (CDR_SCAN_OUT). The second scan path includes the scan data input, the shift register, the update register, and the scan data output.

In some examples, a circuit includes a custom dynamic control data register (CDCDR) circuit having a scan path. The CDCDR circuit includes a shift register and an update register. The shift register is configured to receive scan data from a scan data input (CDR_SCAN_IN) on a first clock edge responsive to a scan enable signal (CDR_SCAN_EN) having an asserted value, a design for test scan enable signal (DFT_SCAN_EN) having a deasserted value, and a capture data register enable signal (CAPTUREDR) having an asserted value or a register enable signal (REGEN) and at least one of a shift data register enable signal (SHIFTDR) or CAPTUREDR having an asserted value. The update register is configured to receive data from the shift register on a second clock edge after the first clock edge responsive to assertion of CDR_SCAN_EN or assertion of REGEN and an update write signal (UPDATEWR), wherein the update register is configured to provide data held in the update register as a scan data output (CDR_SCAN_OUT), and wherein the scan path includes the scan data input, the shift register, the update register, and the scan data output.

In some examples, a circuit includes a shift register that includes an input and an output, an update register that includes an input coupled to the output of the shift register and an output, a first multiplexer that includes a first data input coupled to receive a test input, a second data input coupled to receive a scan input, a control input coupled to receive a scan enable, and an output, and a second multiplexer that includes a first data input coupled to the output of the update register, a second data input coupled to the output of the first multiplexer, and an output coupled to the input of the shift register.

DETAILED DESCRIPTION

A description of a digital system, including test-related hardware, may be analyzed to determine various test patterns for simulating internal nodes and to calculate a percentage of nodes for testing to identify possible faults or defects, such as manufacturing defects. The test patterns may be generated by software in a process called automatic test pattern generation (ATPG). The percentage of tested nodes may be referred to as a test coverage percentage. The test coverage percentage may indicate controllability and observability of a particular digital system design. For example, a high test coverage percentage may indicate high controllability and observability for the digital system. In many industries, such as the automotive and aerospace industries, reliability requirements are comparatively high, motivating requirements for a high test-coverage percentage for digital systems utilized in those industries. By adding hardware to facilitate testing, the test-coverage percentage may be reduced if the added hardware itself is not fully testable. Test-related hardware that is inserted to enable testing may be excluded from testing because these elements may control clocks, resets, design-for-test logic, or overrides, and these elements may enter testing modes that are difficult to control. Such exclusion of the test-related hardware from testing may contribute to a total number of untested nodes in a digital system.

To at least partially mitigate (e.g., reduce) the addition of untested nodes into a digital system by test-related hardware, scan cells with increased testability may be implemented. The disclosed scan cells provide a modified scan cell structure to facilitate a custom scan mode and include custom scan stitching of all elements in separate custom scan chains. In at least some examples of the scan cells, all registers are testable. In this manner, the increased testability of the scan cells improves the overall test-coverage percentage for a design that includes the scan cells, as compared with an otherwise similar design that incorporates traditional scan cells. The described scan cells with custom scan modes (e.g., custom scan cells) may be implemented using any suitable process technology, such as complementary metal oxide semiconductor (CMOS), fin field-effect transistor (FinFET), etc., as well as corresponding fabrication techniques.

Figure 1:
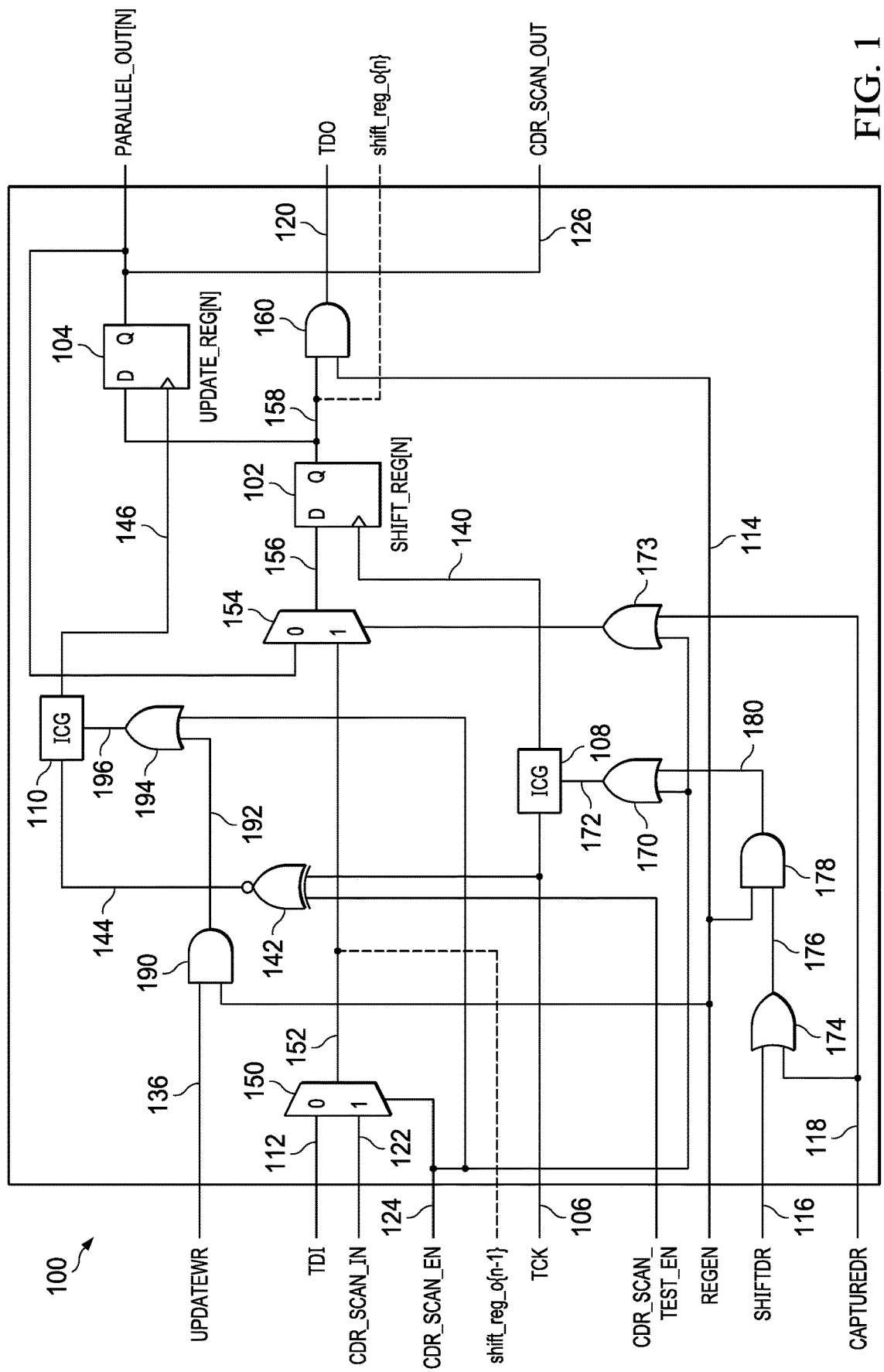
FIG. 1 is a custom control data register (CDR) (CCDR) circuit in accordance with various examples.

FIG. 1 is a block diagram of a custom control data register (CDR) (CCDR) circuit 100, in accordance with various examples. CCDR circuit 100 may be suitable for replacing a standard CDR for use in boundary scan applications conforming to the Institute of Electrical and Electronic Engineers (IEEE) Standard 1149.1, IEEE standard 1149.7, or more generically, IEEE standard 1149.x, or other protocols. CCDR circuit 100 includes a shift register 102 and an update register 104. A shift register typically forms part of a scan chain that may change values during scan operations, while an update register captures a value from a particular shift register output responsive to enablement of an update signal. For example, shift registers may shift data through the CCDR circuit 100 and, responsive to assertion or enablement of the update signal, a value stored by an update register may be updated with a value received by the update register from a shift register. In a scan mode of operation, both shift registers and update registers may be isolated from the scan chain and maintain a programmed value. In this manner, the update register output is typically isolated from changing shift register values. For simplicity, only one shift register 102 and one update register 104 are described, but any suitable number of shift registers 102 and update registers 104 may be implemented in the CCDR circuit 100. Each of the shift register 102 and the update register 104 may be implemented as an array of N serially-coupled scan registers indexed from index [0] to index [N−1], which may be designated SHIFT_REG[N−1:0] and UPDATE_REG[N−1:0], as shown. In at least some examples, N is any suitable positive, non-zero integer value. A test clock (TCK) 106 drives the shift register 102 via an integrated clock gating (ICG) 108, when enabled, and drives the update register 104 via another ICG 110, when enabled. Both ICG 108 and ICG 110 may be considered gated clock networks because they are selectively enabled, such as via an enable or other control signal, as opposed to free-running. ICG 110 is in phase with ICG 108, but delayed based on clock inversion being disabled by the exclusive NOR (XNOR) gate 142 based on CDR_ON_SCAN. In this manner, update register 104 will capture the value held by shift register 102 one clock cycle later when TCK 106 is active and ICG 110 is enabled.

In at least some examples, the CCDR circuit 100 is configured to comply with standards for testability. Such standards include IEEE standard 1149.x (such as IEEE standard 1149.1, IEEE standard 1149.7, etc.). Accordingly, in at least some examples, operation of the CCDR circuit 100 with respect to an update write signal (UPDATEWR) 136, test data input (TDI) 112, TCK 106, register enable signal (REGEN) 114, shift data register enable signal (SHIFTDR) 116, and capture data register enable signal (CAPTUREDR) 118 may be according to IEEE standard 1149, or subsequent standards or standard revisions that incorporate aspects of IEEE standard 1149 (e.g., IEEE standard 1149.x). Description of operation of the CCDR circuit 100 that overlaps with the disclosure of IEEE standard 1149 is not included herein, and reference is instead made to IEEE standard 1149.1, which is incorporated herein by reference in its entirety.

In CCDR circuit 100, a test scan path is provided to enable increased testing coverage of test hardware using ATPG, thereby at least partially mitigating or reducing the challenges described above. The test scan path includes a scan input (CDR_CAN_IN) 122, shift register 102, update register 104, and a scan output (CDR_SCAN_OUT) 126. Shift register 102 is configured to receive scan data provided on CDR_SCAN_IN 122 when a scan enable (CDR_SCAN_EN) 124 signal is enabled. Update register 104 is configured to receive data from shift register 102 one clock cycle later when CDR_SCAN_EN 124 is enabled. In at least some examples, data held in update register 104 is provided as CDR_SCAN_OUT 126 without regard to whether REGEN 114 is enabled. For example, responsive to enablement (e.g., assertion) of CDR_SCAN_EN 124, the ICG 110 may be controlled to provide a clock signal to the update register 104 to cause the update register 104 to provide data to CDR_SCAN_OUT 126 regardless of a value of REGEN 114, upon which operation of the update register 104 may otherwise be based. In this manner, serial test data may be cycled from CDR_SCAN_IN 122, through shift register 102 and update register 104 to CDR_SCAN_OUT 126 when the test scan path is active (e.g., CDR_SCAN_EN 124 is enabled).

CDR_SCAN_EN 124 is provided to a first input of OR gate 170 having an output 172 that drives ICG 108. An output of the ICG 108 is provided via signal line 140 to the clock input of the shift register 102. CDR_SCAN_EN 124 is also provided to an OR gate 173 having an output provided to a select input of the multiplexer 154. SHIFTDR 116 is provided to a first input of OR gate 174 having an OR gate output 176. CAPTUREDR 118 is provided to a second input of OR gate 174 as well as a second input of OR gate 173. REGEN 114 is provided to a first input of an AND gate 178 having an output 180, and OR gate output 176 is provided to a second input of AND gate 178. AND gate output 180 is provided to a second input of OR gate 170. In this manner, ICG 108 is enabled to follow TCK 106 when CDR_SCAN_EN 124 is active or either SHIFTDR 116 is active or CAPTUREDR 118 is active and REGEN 114 is active. UPDATEWR 136 is provided to a first input of AND gate 190 having an output 192 that is provided to a first input of an OR gate 194 having an output 196. REGEN 114 is provided to a second input of AND gate 190, while CDR_SCAN_EN 124 is provided to a second input of OR gate 194. OR gate output 196 enables ICG 110. When enabled, ICG 110 follows (e.g., is driven by) an output of XNOR gate 142, provided on the signal line 144. The XNOR gate 142 performs an XNOR operation between TCK 106 and a scan test enable signal (CDR_SCAN_TEST_EN). For example, during operation according to IEEE standard, such as IEEE standard 1149.x, CDR_SCAN_TEST_EN may have a de-asserted value, such as a value of logical 0, causing TCK 106 to be provided unaltered to the ICG 110. TCK 106, altered, may cause the ICG 110 to operate according to clock inversion (e.g., TCK 106 may be inverted). During operation according to a CDR scan mode, CDR_SCAN_TEST_EN may have an asserted value, such as a value of logical 1. Performing the XNOR operation, via the XNOR gate 142, between TCK 106 and CDR SCAN TEST EN, may disable operation according to clock inversions such that the CCDR circuit 100 operates only at rising clock edges. Shift register 102 output 158 (Q) is provided to an input of update register 104 (D), and output of update register 104 (Q) is provided to a first input of multiplexer 154, forming a feedback loop. In this case, update register 104 output (Q) is the same as second scan output 126 (CDR_SCAN_OUT). Shift register 102 output 158 is also provided to a first input of an AND gate 160. A second input of the AND gate 160 is configured to receive REGEN. Based on the shift register 102 output 158 and REGEN, the AND gate 160 provides a test data output (TDO) 120.

As shown in FIG. 1, operation of the CCDR circuit 100 is as specified by applicable operational standards when CDR_SCAN_EN 124 is not enabled. CCDR circuit 100 may be considered compatible with IEEE standard 1149.x because it includes all capabilities of a standard scan cell, as well as the custom capabilities to facilitate testing, as described herein, such as capabilities related to CDR_SCAN_IN, CDR_SCAN_OUT, CDR_SCAN_EN, and CDR_SCAN_TEST_EN. Responsive to enablement of CDR_SCAN_EN 124, testability of the CCDR circuit 100 may be increased, such as facilitating the providing of programmed data (e.g., provided via CDR_SCAN_IN 122) to the shift register 102 and/or the update register 104. Providing of the programmed data enables determining whether CDR_SCAN_OUT 126 has a value consistent with an expected value based on the programmed data of CDR_SCAN_IN 122 and operations of logic structures of the CCDR circuit 100 in the second scan path between CDR_SCAN_IN 122 and CDR_SCAN_OUT 126. In this way, proper functionality of logic structures of the CCDR circuit 100 may be tested based on programmed data and programmed or expected functionality, increasing a test coverage percentage of the CCDR circuit 100.

Figure 2:
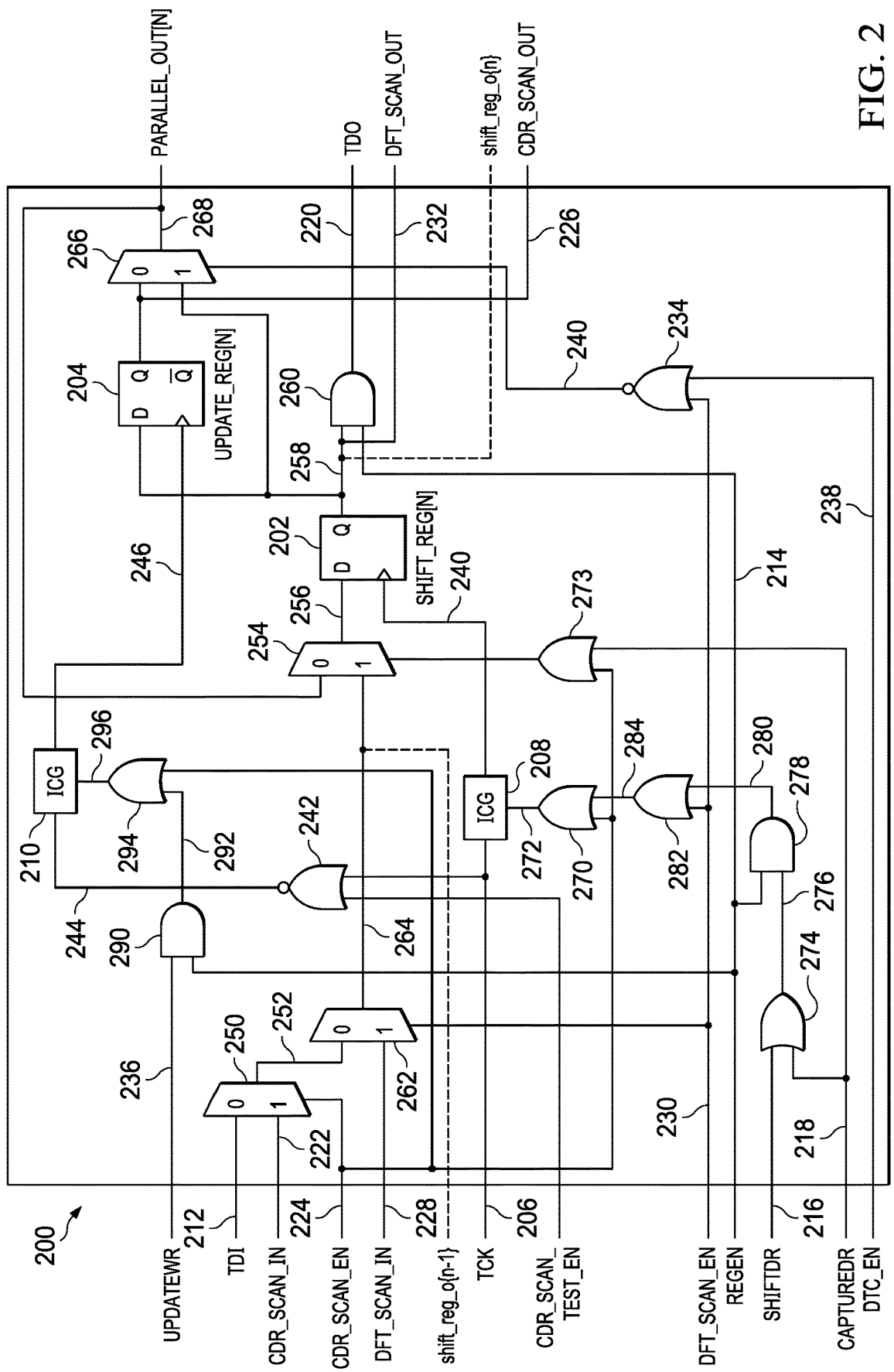
FIG. 2 is a custom dynamic CDR (DCDR) (CDCDR) circuit in accordance with various examples.

FIG. 2 is a block diagram of a custom dynamic CDR (CDCDR) circuit 200, in accordance with various examples. CDCDR circuit 200 may be suitable for replacing a standard scan cell for use in embedded core scan applications conforming to the IEEE standard 1500 or other protocols. CDCDR circuit 200 includes a shift register 202 and an update register 204. For simplicity, only one shift register 202 and one update register 204 are described. Both the shift register 202 and update register 204 may be implemented as an array of serially-coupled scan registers from index [N−1] to index [0], which may be designated SHIFT_REG[N−1:0] and UPDATE_REG[N−1:0], as shown. TCK 206 drives the shift register through an ICG 208, when enabled, and drives the update register through another ICG 210, when enabled. Both ICG 208 and ICG 210 may be considered gated clock networks because they are selectively enabled, such as via an enable or other control signal, as opposed to free-running. TCK 206 drives ICG 208 output 240 and drives an XNOR gate 242 having an output 244 which then drives ICG 210 output 246 indirectly. Shift register 202 captures data on the rising edge of TCK 206 and is driven by ICG 208, while update register 204 captures data on a subsequent falling edge of TCK 206 and is driven by ICG 210 while CDR_SCAN_TEST_EN is deasserted (e.g., is zero). In this manner, update register 204 will capture the value held by shift register 202 one half clock cycle later when TCK 206 is active and ICG 210 is enabled.

In at least some examples, the CDCDR circuit 200 is configured to comply with standards for testability. Such standards include IEEE standard 1500. Accordingly, in at least some examples, operation of the CDCDR circuit 200 with respect to UPDATEWR 236, TDI 212, TCK 206, REGEN 214, SHIFTDR 216, and CAPTUREDR 218 may be according to IEEE standard 1500, or subsequent standards or standard revisions that incorporate aspects of IEEE standard 1500. Description of operation of the CDCDR circuit 200 that overlaps with the disclosure of IEEE standard 1500 is not included herein, and reference is instead made to IEEE standard 1500, which is incorporated herein by reference in its entirety.

In CDCDR circuit 200, a test scan path is provided to enable increased testability coverage using ATPG, thereby at least partially mitigating or reducing the challenges described above. The test scan path includes the CDR_SCAN_IN 222, shift register 202, update register 204, and CDR_SCAN_OUT 226. Shift register 202 is configured to receive scan data presented on a CDR_SCAN_IN 222 when CDR_SCAN_EN 224 is enabled. Update register 204 is configured to receive data from shift register 202 when CDR_SCAN_EN 224 is enabled. Data held in update register 204 is provided as CDR_SCAN_OUT 226 without regard to whether REGEN 214 is enabled. For example, responsive to enablement (e.g., assertion) of CDR_SCAN_EN 224, the ICG 210 may be controlled to provide a clock signal to the update register 204 to cause the update register 204 to provide data to CDR_SCAN_OUT 226 regardless of a value of REGEN 214, upon which operation of the update register 204 may otherwise be based. In this manner, serial test data may be cycled from CDR_SCAN_IN 222, through shift register 202 and update register 204 to CDR_SCAN_OUT 226 when the test scan path is active (e.g., CDR_SCAN_EN 224 is enabled).

CDR_SCAN_EN 224 is provided to a first input of OR gate 270 having an output 272 that drives ICG 208 and to a first input of OR gate 273. SHIFTDR 216 is provided to a first input of OR gate 274 having an OR gate output 276. CAPTUREDR 218 is provided to a second input of OR gate 274 as well as a second input of OR gate 273. REGEN 214 is provided to a first input of an AND gate 278 having an output 280, and OR gate output 276 is provided to a second input of AND gate 278. Also, AND gate output 280 is provided to a second input of OR gate 282 having an output 284. DFT_SCAN_EN 230 is provided to a first input of OR gate 282, and OR gate 282 output 284 is provided to a second input of OR gate 270. OR gate 273 has an output provided to a select input of the multiplexer 254. In this manner, ICG 208 is enabled to follow TCK 206 when CDR_SCAN_EN 224 is active, or DFT_SCAN_EN 230 is active, or either SHIFTDR 216 is active or CAPTUREDR 218 is active and REGEN 214 is active. UPDATEWR 236 is provided to a first input of AND gate 290 having an output 292 that is provided to a first input of an OR gate 294 having an output 296. REGEN 214 is provided to a second input of AND gate 290, CDR_SCAN_EN 224 is provided to a second input of OR gate 294. OR gate output 296 enables ICG 210. When enabled, ICG 210 follows (e.g., is driven by) an output of XNOR gate 242. The XNOR gate 242 performs an XNOR operation between TCK 206 and CDR_SCAN_TEST_EN, such as described above with respect to the CCDR circuit 100 of FIG. 1. Shift register 202 output 258 (Q) is provided to an input of update register 204 (D), a first input of AND gate 260, and a second input of multiplexer 266. AND gate 260 receives REGEN 214 at a second input and an output of AND gate 260 is TDO 220. An output of update register 204 (Q) is provided to a first input of multiplexer 266, which has an output provide to a first input of multiplexer 154, forming a feedback loop. DFT_SCAN_EN 230 is provided to a first input of NOR gate 234, DTC_EN 238 is provided to a second input of NOR gate 234, and NOR gate 234 has a NOR gate output that is provided to a select input of the multiplexer 266. In this case, update register 204 output (Q) is CDR_SCAN_OUT 126.

As shown in FIG. 2, operation of the CDCDR circuit 200 is as specified by applicable operational standards when CDR_SCAN_EN 224 is not enabled. CDCDR circuit 200 may be considered compatible with IEEE standard 1500 because it includes all capabilities of a standard dynamic scan cell, as well as the custom capabilities to facilitate testing, as described herein, such as capabilities related to CDR_SCAN_IN, CDR_SCAN_OUT, CDR_SCAN_EN, and CDR_SCAN_TEST_EN. Responsive to enablement of CDR_SCAN_EN 224, testability of the CDCDR circuit 200 may be increased, such as facilitating the providing of programmed data (e.g., provided via CDR_SCAN_IN 222) to the shift register 202 and/or the update register 204. Providing of the programmed data enables determining whether CDR_SCAN_OUT 226 has a value consistent with an expected value based on the programmed data of CDR_SCAN_IN 222 and operations of logic structures of the CDCDR circuit 200 in the second scan path between CDR_SCAN_IN 222 and CDR_SCAN_OUT 226. In this way, proper functionality of logic structures of the CDCDR circuit 200 may be tested based on programmed data and programmed or expected functionality, increasing a test coverage percentage of the CDCDR circuit 200.

In some examples, the CDCDR circuit 200 includes a third operational mode. In a production ATPG mode, the shift register 202 (and other shift registers which are not shown but may be included in the CDCDR circuit 200) are made part of a scan path of the CDCDR circuit 200. The scan path may be a third scan path of the CDCDR circuit 200. For example, via the multiplexer 266 and NOR gate 234, the shift register 202 may be included in a scan path such that an output of the shift register 202 is provided as PARALLEL_OUT 268. In an example, based on a DFT scan enable signal (DFT_SCAN_EN 230) having an asserted value, a value according to DFT_SCAN_IN 228 is loaded into the shift register 202 via the multiplexer 262 and the multiplexer 254 during a shift phase of the third operational mode of the CDCDR circuit 200. During a subsequent capture phase of the third operational mode of the CDCDR circuit 200, the value loaded to the shift register 202 is provided at PARALLEL_OUT 268 via the multiplexer 266.For example, responsive to either DFT_SCAN_EN 230 or a dynamic toggle control(DTC) signal (DTC_EN 238) having asserted values, PARALLEL_OUT 268 may be provided based on an output of the update register 204. Responsive to both DFT_SCAN_EN 230 and DTC_EN 238 having deasserted values, PARALLEL_OUT 268 may be provided based on an output of the shift register 202. In this way, proper functionality of logic structures of the CDCDR circuit 200 may be further tested based on programmed data and programmed or expected functionality, further increasing a test coverage percentage of the CDCDR circuit 200. For example, a programmed value may be provided at PARALLEL_OUT 268 to facilitate increased controllability in a fanout of PARALLEL_OUT 268, increasing the test coverage percentage of the CDCDR circuit 200.

Figure 3:
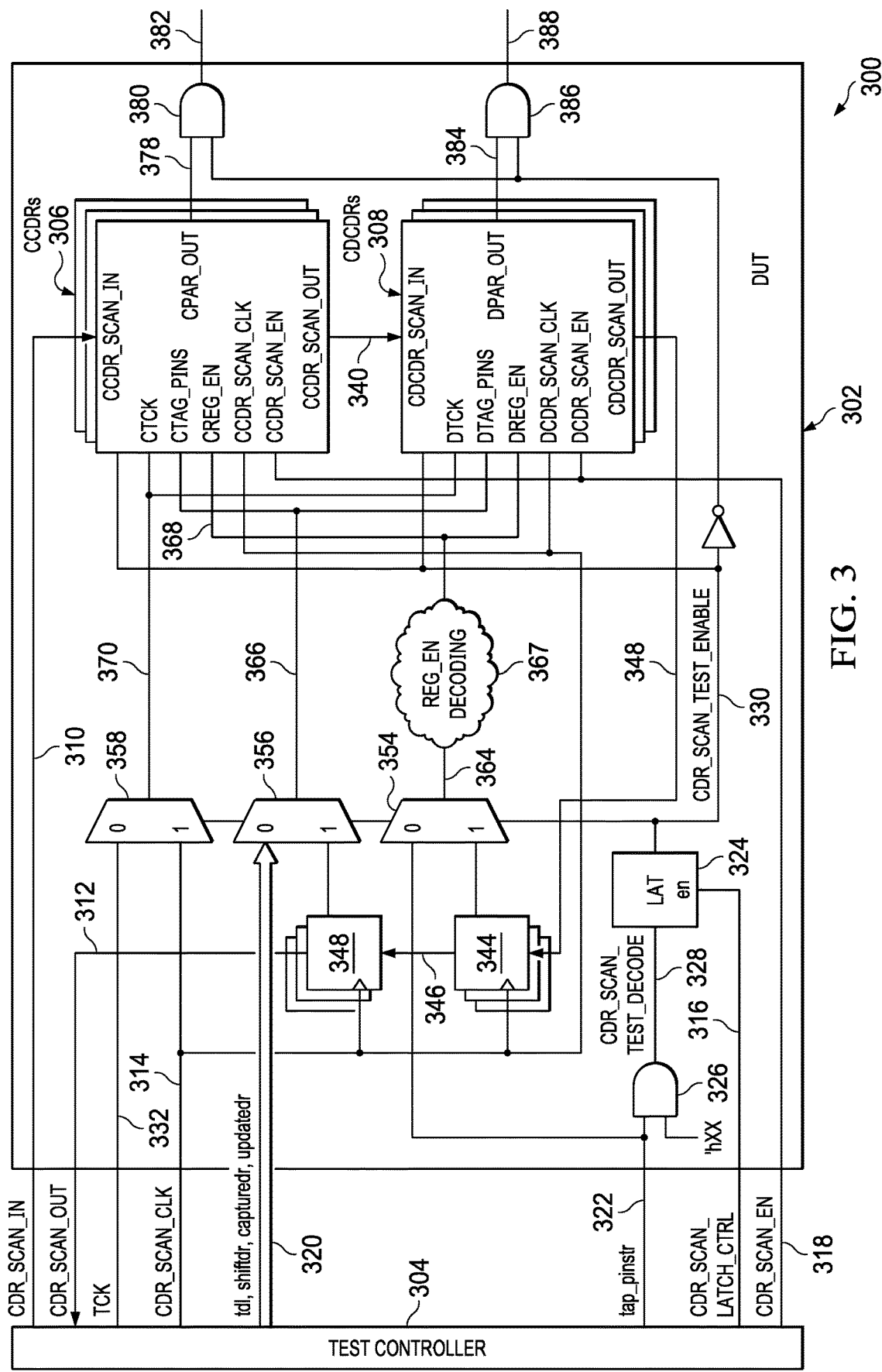
FIG. 3 is a scan test system with a device under test and a test controller in accordance with various examples.

FIG. 3 is a block diagram of a scan test system 300 including a device under test (DUT) 302 and a test controller 304, in accordance with various examples. In at least some examples, the test controller 304 operates according to IEEE standard, such as IEEE standard 1149.x. DUT 302 may include serially-coupled CCDR circuits 306, which may each be substantially similar to the CCDR circuit 100, as described herein with reference to FIG. 1. DUT 302 may also include serially-coupled CDCDR circuits 308, which may each be substantially similar to the CDCDR circuit 200, as described herein with reference to FIG. 2. DUT 302 may also include additional control logic to enable various operations, as shown.

In an example of DUT 302, a system scan chain may begin with CDR_SCAN_IN 310 and may conclude with CDR_SCAN_OUT 312. Within the DUT 302, the system scan chain may traverse multiple hierarchies and multiple scannable elements such as input/output devices, discrete chips, programmable logic devices, or portions thereof. Advancement of serial scan data on the system scan chain may be driven by various signals provided by test controller 304, including a custom test clock (CDR_SCAN_CLK) 314, a custom scan latch control (CDR_SCAN_LATCH_CTRL) 316, and CDR_SCAN_EN 318. The CCDR circuits 306 and CDCDR circuits 308 may be driven by CDR_SCAN_CLK 314.

Test controller 304 may also provide various other control, data, and instructions 320 and a test controller instruction enable (TAP_PINSTR) 322 along with a test mode latch (LAT) 324 that receives instructions 320 that are decoded along with a hard-wired address hXX where the multiple-input decoder is illustrated as a single AND gate 326 to provide an enable signal 328 that is latched (e.g. held) by LAT 324 and provided as CDR_SCAN_TEST_EN 330 to enable testing of DUT 302.

Within DUT 302, a first CCDR circuit 306 may receive custom scan input 310 while the first CCDR circuit 306 output is provided to a custom scan input (CCDR_SCAN_IN) for a second CCDR circuit 306 in the chain, and so on for the serially-coupled CCDR circuits 306. In an example, the last CCDR circuit scan output (CCDR_SCAN_OUT) 340 may be coupled to a scan input (CDCDR_SCAN_IN) for a first CDCDR circuit 308. A scan output from the first CDCDR circuit 308 may be provided as a scan input to a second CDCDR circuit 308 in the chain, and so on for the serially-coupled CDCDR circuits 308. A scan output (CDCDR_SCAN_OUT) 332 from the final CDCDR circuit 308 is provided in the custom scan path to a first decoding register 344 having a scan output 346 that is provided to a second decoding register 348 and finally to CDR_SCAN_OUT 312. The registers in the custom scan chain are driven by CDR_SCAN_CLK 314. First decoding register 344 provides an output (Q) to a second input (1) of a first decoding multiplexer 354. TAP_PINSTR 322 is provided to a first input (0) of first decoding multiplexer 354 and is selected by CDR_SCAN_TEST_EN 330 to provide an output 364 that is applied to decoding logic 367 which is decoded as REGEN 368 and functions as described above in reference to FIG. 1 as REGEN 114 and FIG. 2 as REGEN 214. Second decoding register 348 provides an output (Q) to a second input (1) of a second multiplexer 356 while various other control, data, and instructions 320 are provided to a first input (0) of second multiplexer 356 which provides an output 366 that provides the CCDR circuits 306 and the CDCDR circuits 308 with various signals to facilitate compatibility with various standards, such as IEEE standard 1149.x and/or IEEE standard 1500, as described elsewhere herein. A third decoding multiplexer 358 receives TCK 332 on a first (0) input and CDR_SCAN_CLK 314 on a second (1) input and is selected by CDR_SCAN_TEST_EN 330 to provide a test clock output 370 that is applied to the CCDR circuits 306 and the CDCDR circuits 308 as TCK, as described above herein with reference to FIG. 1 or FIG. 2, respectively. The test data captured by the system scan may be compared with expected or programmed test data to determine correct or suitable circuit behavior and to identify faults. CCDR circuits 306 parallel outs 378 are respectively provided to a first input of a first array of AND gates 380 while a second input of the AND gates 380 is controlled by CDR_SCAN_TEST_EN 330 and provides an output array 382. Similarly, CDCDR circuits 308 parallel outs 384 are respectively provided to a first input of a second array of AND gates 386 while a second input of the AND gates 386 is controlled by CDR_SCAN_TEST_EN 330 and provides an output array 388. While shown in FIG. 3 as arrays of AND gates, in some examples one or both of the first array of AND gates 380 or the second array of AND gates 386 may instead be an array of OR gates, one or more latches, etc.

Figure 4:
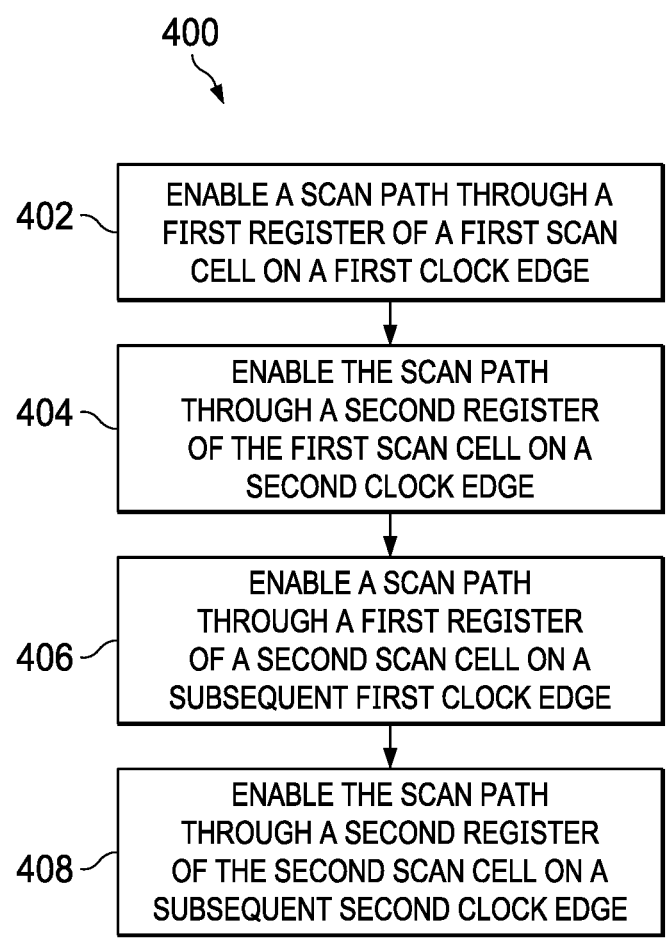
FIG. 4 is a flow diagram of a method of operation of a CCDR circuit in accordance with various examples.

FIG. 4 is a flow diagram of a method 400 of operation of a scan test system in accordance with various examples. In some examples, the method 400 is implemented at least partially by a scan test system, such as the scan test system 300 of FIG. 3 and which includes the DUT 302. The method 400 may be implemented to perform testing of the DUT or another portion of the scan test system. Accordingly, reference may be made in describing the method 400 to components or signals described above with respect to other figures of this description.

At operation 402, a scan path is enabled through a first register of a first scan cell on a first clock edge. In some examples, the first scan cell is the CCDR circuit 100 and the first register is the shift register 102. The scan path may be enabled through the first register as described above with respect to FIG. 1 based at least partially on CDR_SCAN_EN and TCK to load serial test data from CDR_SCAN_IN 122 to the shift register 102. Specific details of signal states or values for loading the serial test data to the shift register 102 are provided above with respect to FIG. 1 and are not repeated herein for the sake of brevity.

At operation 404, the scan path is enabled through a second register of the first scan cell on a second clock edge. In some examples, the second register is the update register 104. The scan path may be enabled through the second register as described above with respect to FIG. 1 based at least partially on CDR_SCAN_EN, CDR_SCAN_TEST_EN, and TCK to load data from the shift register 102 to the update register 104. Specific details of signal states or values for loading data from the shift register 102 to the update register 104 are provided above with respect to FIG. 1 and are not repeated herein for the sake of brevity.

At operation 406, the scan path is enabled through a first register of a second scan cell on a subsequent first clock edge. In some examples, the second scan cell is the CDCDR circuit 200 and the first register is the shift register 202. The scan path may be enabled through the first register as described above with respect to FIG. 2 based at least partially on CDR_SCAN_EN and TCK to load serial test data from CDR_SCAN_IN 222 to the shift register 202. In at least some examples, the serial test data is an output of the update register 104 (e.g., based on the serial test data loaded from CDR_SCAN_IN 122 at operation 402). Specific details of signal states or values for loading the serial test data to the shift register 202 are provided above with respect to FIG. 2 and are not repeated herein for the sake of brevity.

At operation 408 the scan path is enabled through a second register of a second scan cell on a subsequent second clock edge. In some examples, the second register is the update register 204. The scan path may be enabled through the second register as described above with respect to FIG. 2 based at least partially on CDR_SCAN_EN, CDR_SCAN_TEST_EN, and TCK to load data from the shift register 202 to the update register 204. Specific details of signal states or values for loading data from the shift register 202 to the update register 204 are provided above with respect to FIG. 2 and are not repeated herein for the sake of brevity.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Modifications are possible in the described examples, and other examples are possible within the scope of the claims.

What is claimed is:

1. A circuit, comprising:
   a custom control data register (CCDR) circuit having a scan path, the CCDR circuit comprising:
   a shift register configured to:
   receive scan data from a scan data input (CDR_SCAN_IN) on a first clock edge responsive to a scan enable signal (CDR_SCAN_EN) being enabled; and
   an update register configured to:
   receive data from the shift register on a second clock edge after the first clock edge when the scan enable signal (CDR_SCAN_EN) is enabled,
   the update register data being asserted as a scan data output (CDR_SCAN_OUT), and
   wherein the scan path includes the scan data input, the shift register, the update register, and the scan data output.

2. The circuit of claim 1, wherein the scan path includes:
   a first multiplexer having a first input configured to receive a test data input signal (TDI), a second input configured to receive CDR_SCAN_IN, a control input configured to receive CDR_SCAN_EN, and an output; and
   a second multiplexer having a first input coupled to an output of the update register, a second input coupled to the output of the first multiplexer, a control input, and an output coupled to a data input of the shift register.

3. The circuit of claim 2, further comprising an OR logic gate having a first input configured to receive CDR_SCA- N_EN, a second input configured to receive a capture data register enable signal (CAPTUREDR), and an output coupled to the control input of the second multiplexer.

4. The circuit of claim 2, further comprising:
a first integrated clock gating circuit having an input, a gate control input, and an output, the output of the first integrated clock gating circuit coupled to a clock input of the update register;
a second integrated clock gating circuit having an input configured to receive a test clock (TCK), a gate control input, and an output, the output of the second integrated clock gating circuit coupled to a clock input of the shift register;
an OR logic gate having a first input, a second input configured to receive CDR_SCAN_EN, and an output coupled to the first integrated clock gating circuit gate control input;
an exclusive OR (XOR) logic gate having a first input configured to receive a scan test enable signal (CDR_SCAN_TEST_EN), a second input configured to receive TCK, and an output coupled to the first integrated clock gating circuit gate control input; and
an AND logic gate having a first input configured to receive an update write signal (UPDATEWR), a second input configured to receive a register enable signal (REGEN), and an output coupled to the first input of the OR logic gate.

5. The circuit of claim 4, further comprising:
a second OR logic gate having a first input configured to receive (SHIFTDR), a second input configured to receive a capture data register enable signal (CAPTUREDR), and an output; and
an AND logic gate having a first input configured to receive REGEN, a second input coupled to the output of the second OR logic gate, and an output coupled to the first input of the OR logic gate.

6. The circuit of claim 2, further comprising an AND logic gate having a first input coupled to an output of the shift register, a second input configured to a register enable signal (REGEN), and an output configured to provide a test data output signal (TDO).

7. The circuit of claim 1, wherein the CCDR circuit is compatible with IEEE standard 1149.

8. The circuit of claim 1, further comprising a logic circuit having a first input, a second input, and an output, wherein the CCDR circuit has an output coupled to the first input of the logic circuit, the second input of the logic circuit is configured to receive an inverted version of a scan test enable signal (CDR_SCAN_TEST_EN), and an output of the circuit is provided at the output of the logic circuit, and wherein the logic circuit is configured to prevent passing of an output signal from the output of the CCDR circuit to the output of the logic circuit responsive to CDR_SCAN_TEST_EN having an asserted value.

9. A circuit, comprising:
a custom dynamic control data register (CDCDR) circuit having a scan path, the CDCDR circuit comprising:
a shift register configured to:
receive scan data from a scan data input (CDR_SCAN_IN) on a first clock edge responsive to a scan enable signal (CDR_SCAN_EN) having an asserted value, a design for test scan enable signal (DFT_SCAN_EN) having a deasserted value, and a capture data register enable signal (CAPTUREDR) having an asserted value or a register enable signal (REGEN) and at least one of a shift data register enable signal (SHIFTDR) or CAPTUREDR having an asserted value; and
an update register configured to:
receive data from the shift register on a second clock edge after the first clock edge responsive to assertion of CDR_SCAN_EN or assertion of REGEN and an update write signal (UPDATEWR), wherein the update register is configured to provide data held in the update register as a scan data output (CDR_SCAN_OUT), and wherein the scan path includes the scan data input, the shift register, the update register, and the scan data output.

10. The circuit of claim 9, further comprising:
a first multiplexer having a first input configured to receive a test data input signal (TDI), a second input configured to receive CDR_SCAN_IN, a control input configured to receive CDR_SCAN_EN, and an output;
a second multiplexer having a first input coupled to the output of the first multiplexer, a second input configured to receive a design for test data input (DFT_SCAN_IN), a control input configured to receive DFT_SCAN_EN, and an output; and
a third multiplexer having a first input configured to receive an output of the circuit, a second input coupled to the output of the second multiplexer, a control input, and an output, the output of the third multiplexer coupled to a data input of the shift register.

11. The circuit of claim 10, further comprising:
a first integrated clock gating circuit having an input, a gate control input, and an output, the output of the first integrated clock gating circuit coupled to a clock input of the shift register;
a first OR logic gate having a first input configured to receive CDR_SCAN_EN, a second input, and an output coupled to the gate control input of the first integrated clock gating circuit;
a second OR logic gate having a first input configured to receive DFT_SCAN_EN, a second input, and an output coupled to the second input of the first OR logic gate; and
a third OR logic gate having a first input coupled to the output of the second OR logic gate, a second input configured to receive CAPTUREDR, and an output.

12. The circuit of claim 11, further comprising
a fourth OR logic gate having a first input configured to receive SHIFTDR, a second input configured to receive CAPTUREDR, and an output; and
an AND logic gate having a first input configured to receive REGEN, a second input coupled to the output of the fourth OR logic gate, and an output coupled to the second input of the second OR logic gate.

13. The circuit of claim 9, further comprising:
a NOR logic gate having a first input configured to receive DFT_SCAN_EN, a second input configured to receive a dynamic toggle control enable signal (DTC_EN), and an output;
an AND logic gate having a first input coupled to an output of the shift register, a second input configured to receive REGEN, and an output configured to provide a test data output signal (TDO); and
a multiplexer having a first input coupled to an output of the update register, a second input coupled to the output of the shift register, a control input coupled to the output of the NOR logic gate, and an output configured to provide a parallel output signal (PARALLEL_OUT).

14. The circuit of claim 13, wherein the shift register is configured to receive test data from a design for test data input (DFT_SCAN_IN) on a third clock edge responsive to DFT_SCAN_EN having an asserted value and CAPTUREDR having an asserted value or REGEN)and at least one of SHIFTDR or CAPTUREDR having an asserted value.

15. The circuit of claim 14, wherein the shift register is configured to provide the test data as PARALLEL_OUT via the multiplexer responsive to DFT_SCAN_EN AND DTC_EN.

16. The circuit of claim 9, further comprising:
a second integrated clock gating circuit having an input, a gate control input, and an output, the output of the second integrated clock gating circuit coupled to a clock input of the update register;
an OR logic gate having a first input, a second input configured to receive CDR_SCAN_EN, and an output coupled to the second integrated clock gating circuit gate control input;
a NOR logic gate having a first input configured to receive a scan test enable signal (CDR_SCAN_TEST_EN), a second input configured to receive a test clock (TCK), and an output coupled to the second integrated clock gating circuit gate control input; and
an AND logic gate having a first input configured to receive an update write signal (UPDATEWR), a second input configured to receive REGEN, and an output coupled to the first input of the OR logic gate.

17. The circuit of claim 16, further comprising a logic circuit having a first input, a second input, and an output, wherein the CDCDR circuit has an output coupled to the first input of the logic circuit, the second input of the logic circuit is configured to receive an inverted version of CDR_SCAN_TEST_EN, and an output of the circuit is provided at the output of the logic circuit, and wherein the logic circuit is configured to prevent passing of an output signal from the output of the CDCDR circuit to the output of the logic circuit responsive to CDR_SCAN_TEST_EN having an asserted value.

18. The circuit of claim 9, wherein the CDCDR circuit is compatible with IEEE standard 1500.

19. A circuit, comprising:
a shift register that includes an input and an output;
an update register that includes an input coupled to the output of the shift register and an output;
a first multiplexer that includes a first data input coupled to receive a test input, a second data input coupled to receive a scan input, a control input coupled to receive a scan enable, and an output; and
a second multiplexer that includes a first data input coupled to the output of the update register, a second data input coupled to the output of the first multiplexer, and an output coupled to the input of the shift register.

20. The circuit of claim 19, wherein responsive to assertion of the scan enable, the first multiplexer is configured to provide the scan input to the second multiplexer to cause the scan input to be received at the input of the shift register.

\* \* \* \* \*